US009049787B2

(12) United States Patent
Bugg

(10) Patent No.: US 9,049,787 B2
(45) Date of Patent: Jun. 2, 2015

(54) PADDLE CARD WITH IMPROVED PERFORMANCE

(71) Applicant: Molex Incorporated, Lisle, IL (US)

(72) Inventor: Mark Alan Bugg, Maumelle, AR (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/745,352

(22) Filed: Jan. 18, 2013

(65) Prior Publication Data

US 2014/0202751 A1    Jul. 24, 2014

(51) Int. Cl.
*H05K 1/09* (2006.01)
*H05K 1/02* (2006.01)
*H01R 9/03* (2006.01)
*H01R 13/6474* (2011.01)

(52) U.S. Cl.
CPC .............. *H05K 1/0296* (2013.01); *H01R 9/032* (2013.01); *H01R 13/6474* (2013.01)

(58) Field of Classification Search
CPC ........ H01R 12/53; H01R 12/57; H01R 12/62; H01R 12/775; H01R 13/6466; H01R 12/52; H01R 13/6658; H01R 12/79; H01R 43/0256; H01R 9/091; H01R 4/02; H01R 9/0515; H01R 12/707; H01R 9/05; H01R 12/78; H01R 12/81; H05K 1/117; H05K 1/0218; H05K 2201/10356; H05K 3/32; H05K 2201/09036; H05K 2201/09145; H05K 2201/10287; H05K 3/363; H05K 1/0246; H05K 13/0465; H05K 2201/0999; H05K 2201/09809; H05K 1/0237

USPC .............. 174/250–268, 88 R, 75 C, 78, 88 C; 439/59, 62, 629, 83, 497, 579, 610
See application file for complete search history.

(56) References Cited

U.S. PATENT DOCUMENTS

| | | | |
|---|---|---|---|
| 3,770,874 A * | 11/1973 | Krieger et al. ................. | 174/257 |
| 4,602,832 A | 7/1986 | Cunningham et al. | |
| 4,871,319 A | 10/1989 | Babow | |
| 4,993,968 A | 2/1991 | Guletsky et al. | |
| 5,122,065 A | 6/1992 | Dudek et al. | |
| 5,364,292 A | 11/1994 | Bethurum | |
| 5,679,008 A | 10/1997 | Takahashi et al. | |
| 5,810,620 A | 9/1998 | Kobayashi et al. | |
| 6,139,364 A | 10/2000 | Beutler et al. | |
| 6,190,196 B1 | 2/2001 | Kato | |
| 6,371,805 B1 | 4/2002 | Wang et al. | |
| 6,575,772 B1 | 6/2003 | Soubh et al. | |
| 6,661,318 B2 | 12/2003 | Tamaki et al. | |
| 6,685,511 B2 | 2/2004 | Akama et al. | |
| 6,857,898 B2 | 2/2005 | Engquist et al. | |
| 6,880,241 B2 | 4/2005 | Edwardsen et al. | |
| 6,893,270 B2 * | 5/2005 | Sercu ........................... | 439/76.1 |
| 6,927,655 B2 | 8/2005 | Torigoe et al. | |
| 6,994,563 B2 | 2/2006 | Amini et al. | |

(Continued)

*Primary Examiner* — Ishwarbhai B Patel

(57) ABSTRACT

A paddle card construction disclosed for use in connecting electronic devices together. The paddle card takes the form of a circuit board that has a plurality of conductive contact pads arranged thereon in pairs. The contact pads of each pair are spaced apart from each other to provide a pair of points to which cable wire free ends may be terminated, such as by soldering. The spacing of the pads apart from each other in effect reduces to amount of capacitance in the cable wire termination area on the circuit board, thereby reducing the impedance and insertion loss in that area at high frequencies. The contact pads of each pair may be further interconnected together by a thin, conductive trace that extends lengthwise between the contact pads.

10 Claims, 5 Drawing Sheets

(56) References Cited

U.S. PATENT DOCUMENTS

| | | |
|---|---|---|
| 7,046,020 B2 | 5/2006 | LaMeres et al. |
| 7,223,915 B2 | 5/2007 | Hackman |
| 7,244,126 B2 | 7/2007 | Morana et al. |
| 7,412,923 B2 * | 8/2008 | Shaeffer et al. ............... 101/127 |
| 7,498,523 B2 | 3/2009 | Miller |
| 7,520,757 B2 | 4/2009 | Bartholomew |
| 7,637,779 B2 | 12/2009 | Nagata et al. |
| 7,648,372 B2 | 1/2010 | Wu |
| 7,887,339 B2 | 2/2011 | Kumamoto et al. |
| 8,337,243 B2 | 12/2012 | Elkhatib et al. |
| 8,662,917 B2 | 3/2014 | Wang et al. |
| 8,696,378 B2 | 4/2014 | Behziz et al. |
| 2014/0206230 A1 | 7/2014 | Rost et al. |

* cited by examiner

PADDLE CARD WITH IMPROVED PERFORMANCE

BACKGROUND OF THE PRESENT DISCLOSURE

The Present Disclosure relates, generally, to cable interconnection systems, and, more particularly, to improved cable assemblies for use in high speed data transmission applications.

Conventional cable interconnection systems are found in electronic devices, such as routers, servers and the like, and are used to form signal transmission lines. These transmission lines may extend between chip members and connectors, connectors in two different devices, and between devices themselves. Most often, differential signal wires are used for each such transmission line in a cable and, although it is easy to maintain a desired impedance profile along the length of the cable due to the cable geometry, it is difficult to maintain such a profile where the wire ends are terminated to a circuit board or paddle card. The wires are terminated to contact pads that are disposed on a surface of the circuit board. In such a situation, the exterior insulation is stripped back and the bare conductors are terminated to solder pads or the like. The contact/solder pads are elongated and are generally rectangular in shape, with one pad being associated with only one wire. This type of termination always has impedance discontinuities associated with it.

The Present Disclosure is therefore directed to a circuit board, or paddle card, for use with a cable assembly particularly suitable for high speed data transmission applications, and which includes an improved termination area that reduces the impedance discontinuity which occurs with the termination of cable wires to elongated rectangular contact pads located on the paddle card.

SUMMARY OF THE PRESENT DISCLOSURE

Accordingly, there is provided an improved paddle card having an improved termination structure which promotes beneficial termination in high speed data transmission applications.

In accordance with an embodiment described in the Present Disclosure, a cable assembly is disclosed that utilizes a specially configured circuit board, or paddle card, to which the wires of the cable are terminated. Instead of conventional elongated, rectangular contact pads, the circuit board termination area for each single wire of the cable assembly is formed with two distinct contact sections associated with each signal wire of the cable. In one embodiment, the two contact pads for each wire are spaced apart from each other lengthwise along the circuit board. In another embodiment, the two contact pads for the wire are spaced apart from each other, but are connected by a thin trace extending lengthwise between the two pads, the width of the connecting trace being a fraction of the width of the contact pads, so that when viewed from above this contact pad arrangement has a "dogbone" configuration.

The use of two contact pads in place of one elongated contact pad reduces the overall area of the termination structure for each wire terminated to the circuit board. Preferably, the two contact pads are spaced apart by an intervening spacing equal to or greater than that of one of the contact pads. The elimination of this extra conductive surface area reduces the capacitance, as compared to a regular, elongated rectangular contact pad, thereby reducing the impedance discontinuity that normally occurs in transition from the structured order of the cable wires to their termination on the surface of the circuit board. This modification of the impedance profile is important in that the circuit board termination area is prone to crosstalk, and flattening out the impedance discontinuity curve gives the cable and connector structure a better impedance profile and results in reduced crosstalk and electrical noise. In one of the embodiments of the Present Disclosure, the total length of the two contact pads may range between about 0.5 to about 0.8 of the total length between exterior ends of the contact pads. Similarly, the contact pads are preferably separated by an intervening distance of between about 20% to about 40% of the total length between the opposing edges of a pair of the contact pads.

These and other objects, features and advantages of the Present Disclosure will be clearly understood through a consideration of the following detailed description.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
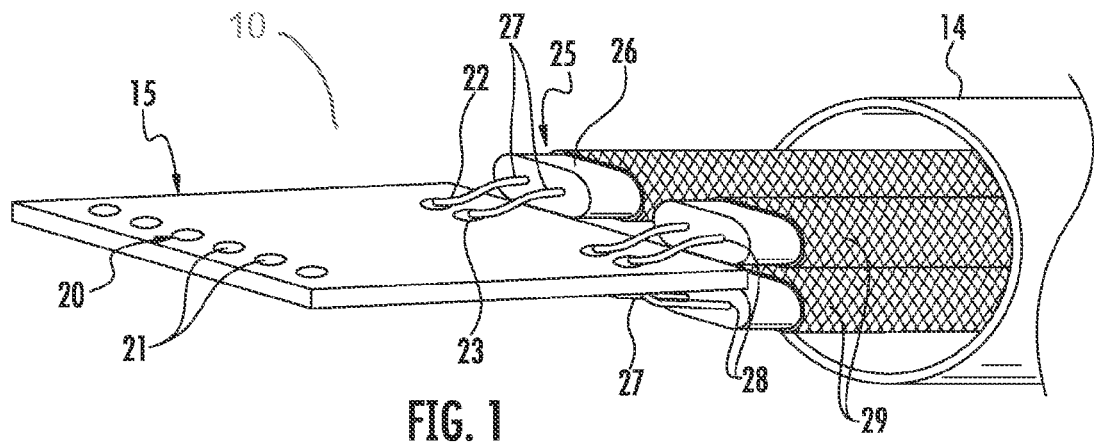
FIG. 1 is a perspective view of a paddle card style circuit board with wires of a cable assembly terminated thereto.
Figure 2:
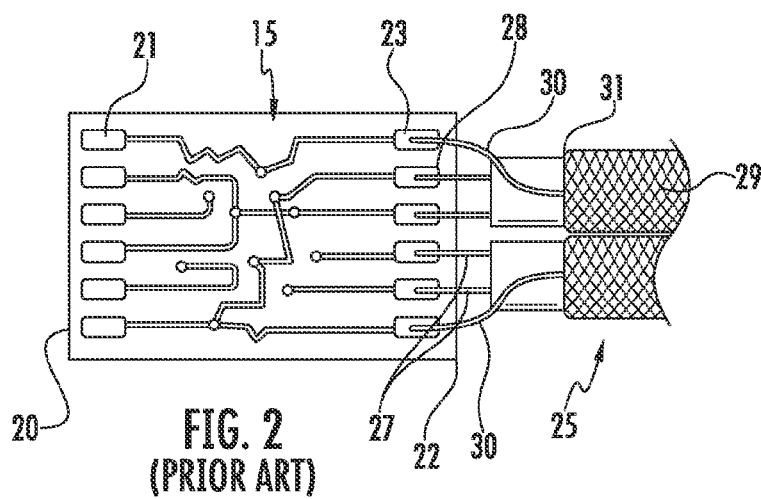
FIG. 2 is a top plan view of the structure illustrated in FIG. 1.
Figure 3:
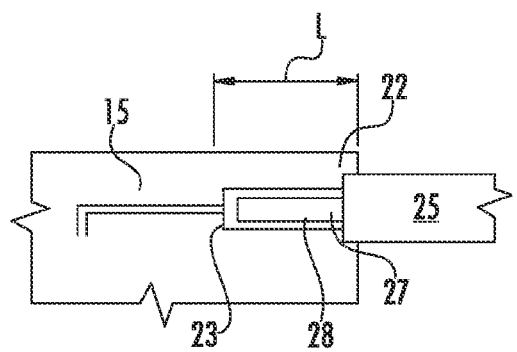
FIG. 3 is an enlarged top plan view of a one of the contact pads and a wire terminated thereto in the assembly of FIG. 2.

FIGS. 1-3 illustrate a conventional cable assembly used to connect multi-wire cables to circuit boards house within connector housings in order to provide a connector. Typically, a connector 10 of a plug style has a protective outer connector housing with a hollow termination end that receives an end of a multiple-wire cable 14 and, at its opposite end, a smaller mating connector end. The mating end of the connector holds a mating blade, shown as a circuit board, or paddle card, 15 in an orientation suitable for mating with an opposing, mating receptacle connector (not shown) that has a slot which receives the forward end of the circuit board 15. In order to provide a means for ensuring engagement with the opposing connector after mating with it, the connector may be provided with a latch member that mates with the housing of an opposing connector.

FIG. 1 is a perspective view of a conventional termination structure used to connect the individual wires 25 of the cable 14 to individual circuits on the circuit board 15, which takes the form of a paddle card. As shown, the cable 14 encloses a plurality of wires 25, and the signal wires thereof illustrated are of the twin-ax construction, with signal conductors 27 running lengthwise and the conductors 27 are spaced apart from each other. The inner signal conductors 27 are surrounded by an outer insulative covering 26. Free ends 28 of the signal conductors 27 extend forwardly past the leading ends of the wire insulative coverings 26. The insulative covering 26 is typically itself enclosed by an outer shield member 29, which is shown in FIGS. 1-2 as a braided wire, but which may take the form of a conductive shield formed from a copper foil or the like.

Turning to FIG. 2, which is a plan view of the termination structure shown in FIG. 1, it can be seen that the circuit board 15 takes the general form of a rectangle and has opposing leading and trailing edges 20, 22. The leading edge 20 is the forwardmost edge of the circuit board 15, or to the left in FIG. 2, and is that portion of the circuit board 15 inserted into the card-receiving slot of an opposing, mating connector, not shown. In this regard, the circuit board 15 is typically formed with an array of conductive mating contacts 21 arranged thereon which mate with terminals of the opposing mating connector. Similarly, the trailing edge 22 of the circuit board 15 defines a termination area where the free ends 28 of the cable wire signal conductors 27 are terminated to the circuit board 15. In order to accommodate all of the wires, the circuit board 15 has an array of termination structures, each taking the form of a single contact pad 23. These contact pads are arranged in a pattern proximate to the trailing edge 22 of the circuit board 15.

In termination, the free ends 28 of the cable wire signal conductors 27 are exposed by removing a given length of their outer covering 26, and the outer shield member 29 also has a portion of it removed. Drain wires 30 may be provided in the cable and are associated with each of the twin-ax pairs of wires. They are separately attached to the circuit board, either by direct attachment or by way of a cradle (not shown), and connected to an internal ground plane layer of the circuit board 15. As illustrated, the wire free ends 28 are attached to the termination (rearmost) contact pads 23 by a suitable method such as soldering, and in such an attachment method, the solder not only contacts the contact pad 23, but also creates a fillet alongside the body of the wire free ends 28 which runs the length of the termination contact pad 23 on both sides of the wire free end 28.

Due to the ordered structure of the wires 25 in the cable 14, it is relatively easy to maintain a desired impedance profile throughout the length of the cable 14. Twisted pair wires are commonly used to transmit differential signals and are most commonly used in high-speed electrical transmission cables. These signal cables have one or more twisted pairs of wires that are twisted together along the length of the cable, with each such twisted pair being encircled by an associated grounding shield. These twisted pairs typically receive complimentary signal voltages, i.e., one wire of the twisted pair will carry a +1.0 volt signal, while the other wire of the twisted pair will carry a −1.0 Volt signal. The wire pairs are twisted together along the axis of the cable so that each of the wires extends in a helical path along the cable and the wires are spaced apart from each other the same distance along this helical path for the length of the cable. The impedance of twisted pair transmission cables may be very easily controlled at a desired level, because it is relatively simple to maintain a specific geometry or physical arrangement of the signal conductors and the grounding shield. However, an impedance change will usually be encountered in the area where the cable is mated to a connector, or a circuit board that is part of a connector.

Figure 7:
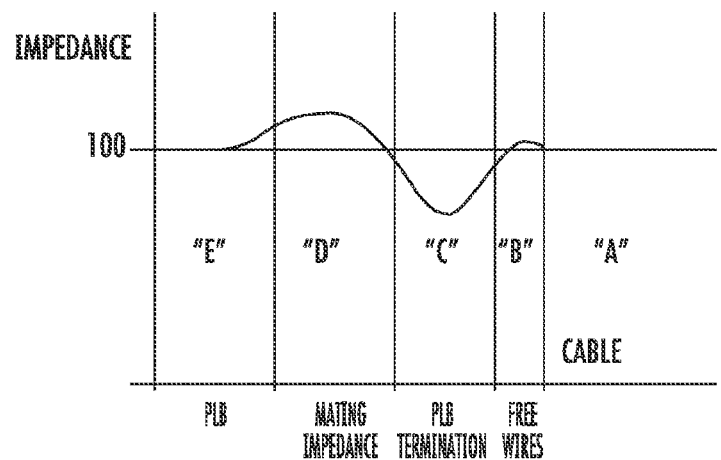
FIG. 7 is a diagram of an impedance plot through a connector system, with a multi-wire cable on the right side thereof, then the termination area of the cable wires adjacent it, the connector mating interface and the device connector termination to a circuit board on the left side thereof.

This ordered structure of the cable ends where the transition from the cable 14 to the circuit board 15 occurs, namely, at the cable termination area, as the wires 25 of each pair of twin-ax wires 25 are first untwisted, and subsequently moved apart from each other and soldered to their associated contact pads 23. A typical impedance profile of a structure, such as the known one illustrated in FIG. 1, which uses a cable connector mating to a receptacle connector located in an electronic device, is illustrated in FIG. 7, which displays the impedance discontinuity that occurs through the connector system. FIG. 7 illustrates the ordered geometry of the cable 14 at A, to the area where the free ends 28 of the cable wires 25 are untwisted at B, and then to the area where the termination of the wire free ends 28 to the circuit board (or paddle card) 15 occur at C. Following further through the connector system, from right to left in FIG. 7, the area where the circuit board 15 mates with an opposing connector, namely, the connector interface area is shown at D and this area is followed by the transition area at E where the receptacle connector is itself connected to circuit traces of the circuit board in the electronic device.

Area A plots the transmission cable, which because of its ordered geometry, has a constant baseline impedance of about 100 ohms. It is desirable to try to maintain this constant value through the connector system. Such a tolerance cannot be maintained and hence, designers attempt to keep the discontinuities down to at least a +/−10% of the 100 ohm baseline value, and as low as +/−5% of the 100 ohm baseline. In area B, the twisted pair wires are spread apart in order to align them with the termination contact pads 23 and this movement causes a rise in the system impedance as shown. Next, the wire free ends are terminated to the termination contact pads 23, which results in a drop of the impedance as at C. Then, in the area where the two connectors mate, the impedance rises in area D and then the impedance returns to its baseline value of 100 ohms in area E, where the signal transmission path is largely encompassed within a circuit board. Keeping the impedance discontinuity, i.e., the peaks and valleys shown in FIG. 7 to no more than a 10% deviation from the baseline reduces crosstalk and noise.

It has been discovered that the impedance discontinuity may be controlled in the cable wire termination area to meet the 10% tolerance target and lower, in a simple, cost-effective manner. A manner of accomplishing this involves interrupting the traditional rectangular structure of the termination contact pads 23 by eliminating a portion of the contact pads. Such a structure is illustrated in FIGS. 4-6, where it can be seen that the formerly elongated rectangular contact pads 23 with a length of L have been replaced by a pair of spaced-apart contact pads 23a and 23b which have respective lengths of L1 and L2.

Figure 4:
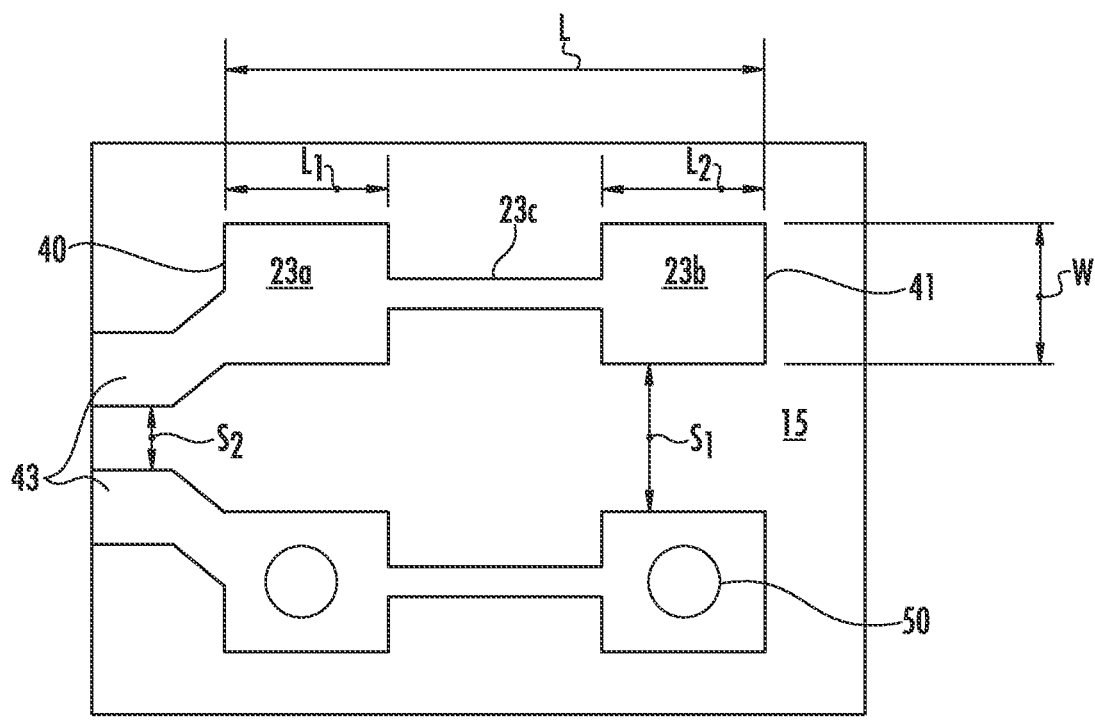
FIG. 4 is a top plan view of one embodiment of the termination area of an improved circuit board constructed in accordance with the principles of the Present Disclosure.
Figure 5:
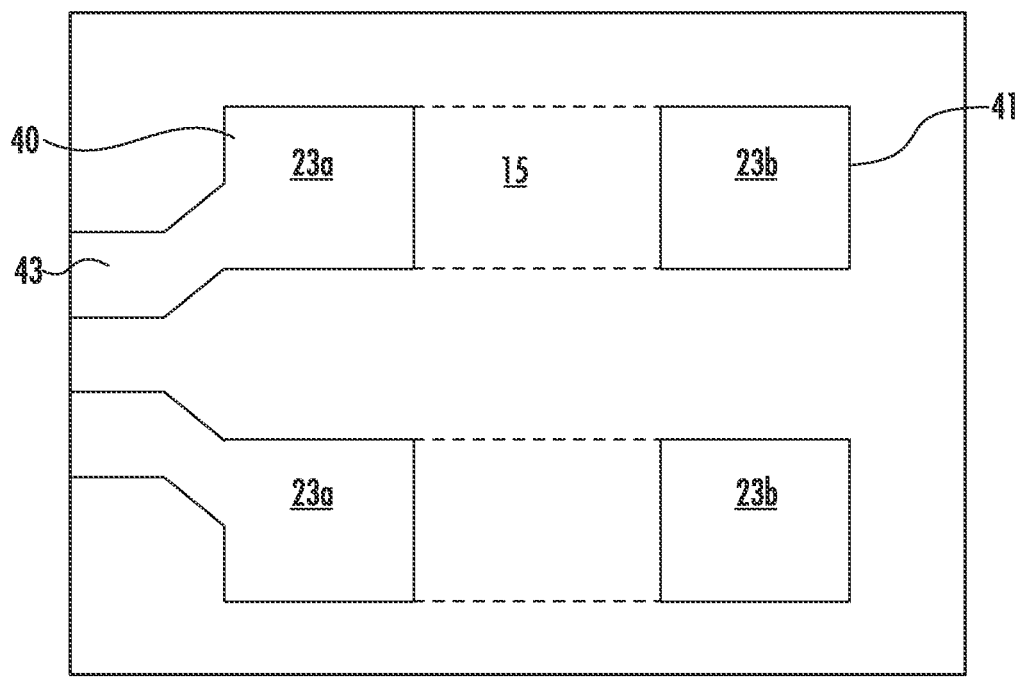
FIG. 5 is a top plan view of another embodiment of the termination area of FIG. 4.
Figure 6:
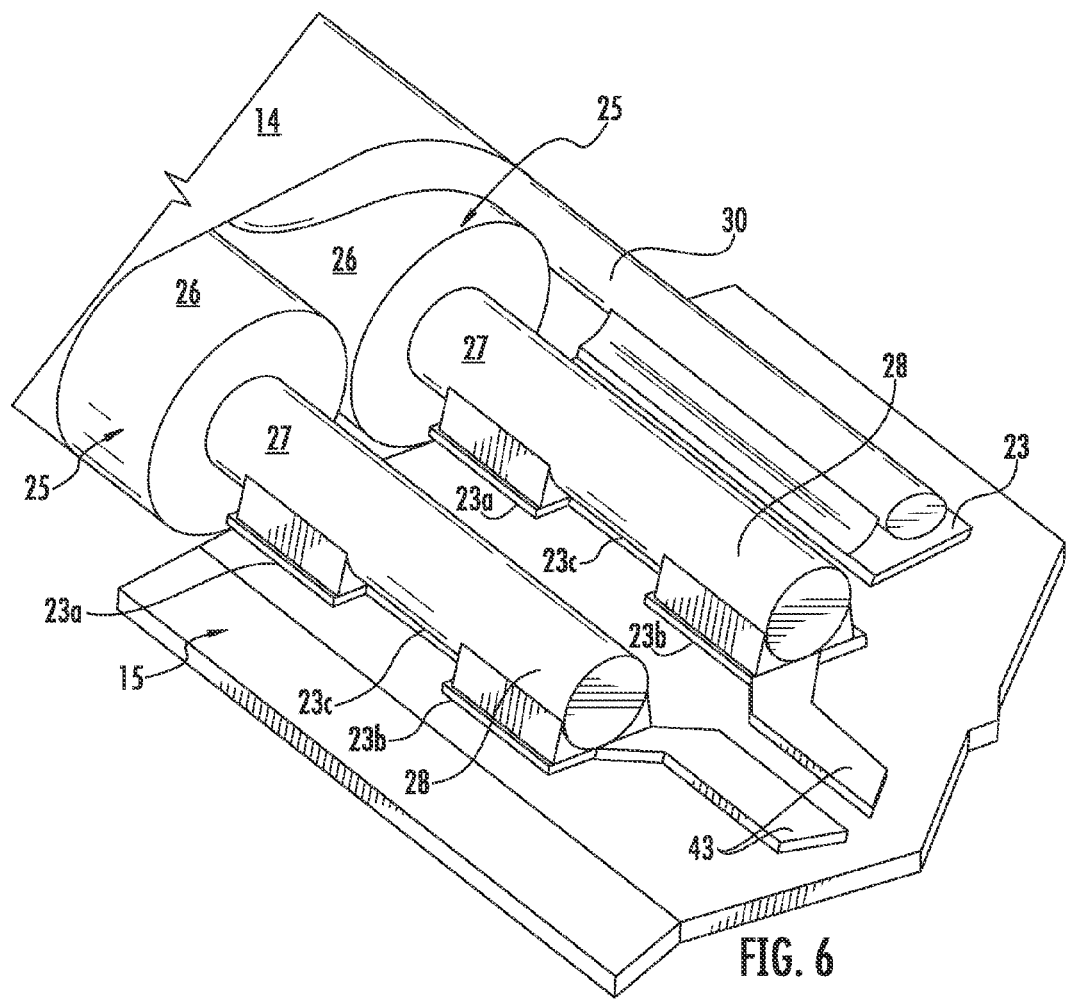
FIG. 6 is an enlarged perspective view of the cable wire-termination area of a circuit board incorporating the principles of the Present Disclosure utilizing a construction of the termination area of FIG. 4.

This length L extends from the leading edge 40 of the forwardmost contact pad 23a in FIGS. 4-5 to the trailing edge 41 of the rearmost contact pad 23b. The pair of contact pads 23a, 23b are preferably aligned with each other lengthwise along the circuit board 15 so that their sides edges are coincident, as noted by the dashed lines in FIG. 5. The total length of the pair of contact pads 23a, 23b is L3, which is the sum of the two lengths, i.e., L1+L2, which, as illustrated, is less than L. The lengths L1 and L2 may vary in accordance with the gauge of the cable wires 25, and will be a percentage of L. Good results have been obtained in circuit boards utilizing the following lengths: L1=0.8 mm, L2=0.8 mm and L=2.6 mm, meaning that the intervening spacing that separates the two contact pads 23a, 23b is equal to 1.0 mm. With such dimensions, L3 is equal to about 0.61 L.

The width, W of the contact pads above, are all constant and preferably will not vary among the contact pads. In the example set forth above, the contact pads 23a, 23b have had a width of 0.7 mm. Such a dimension ensures enough room on the pad for the solder attachment, the cable wire free end and also provides enough area for adhesion to the circuit board. As such, the width of the contact pads will be a constant and only the length of the contact pads will vary, based upon the particular application. However, it will be understood that some applications will dictate increasing or decreasing the width of the contact pads and to date it is believed that 0.5 mm is about the smallest width which can be used and still have enough area to receive a via 50, as explained to follow.

It is believed that the advantages described herein with respect to the Present Disclosure will also be attainable with L3/L ratios of 1.6/2 or 1/2 in instances where the total length is about 2.0 mm or L1 and L2 are about no more than 0.5 mm. In these instances, L3 will vary from about 0.5 L to about 0.8 L. Similarly, the intervening spacing between the contacts pads 23a, 23b of each pair of pads can preferably range from between about 0.2 L and about 0.4 L with a preferred length being about 1.0 mm. Hence, it is preferred that L3 can range from about 0.5 L to about 0.8 L. The contact pads 23a, 23b, as illustrated, may take either a square or a rectangular configuration. The contact pads 23a, 23b may further include vias 50 that extend into the circuit board 15. One via 50 may be provided for each contact pad of the pair of contact pads 23a, 23b as shown in the bottom portion of FIG. 4, or the via 50 may be disposed in either the forwardmost contact pad 23a or the rearmost contact pad 23b. The use of the vias 50 may be beneficial to the circuit board design in that it can provide an anchoring point for its associated contact pad, increasing its resistance to removal, or peel strength.

In another embodiment of the Present Disclosure and as illustrated in FIG. 4, the two contact pads 23a, 23b may be preferably interconnected by a thin conductive connecting trace 23c that extends between the two contact pads 23a, 23b. The placement of the trace 23c may be anywhere between the side edges of the contact pads and preferably, the trace 23c is centered between the side edges so that the wire free end 28 may extend along it and so the trace provides a coupling path for the wire. In this orientation, the connecting trace 23c mirrors the extent of the exposed signal conductor in its extent on the surface of the circuit board. In testing, connecting traces 23c having widths of about 0.2 mm have been used with contact pads 23a, 23b having widths of about 0.7 mm with suitable results. With such a structure, the elimination of the metal area between the contact pads but for the connecting trace results in an overall plate reduction of about 27% as compared to the full plate having dimensions of L×W. It is believed that using two contact pads, with or without the connecting trace, with dimensions that reduce the metal plate area between about 25% to about 40% will provide the desired results. In other words, it is desirable to reduce the contact pad area by at least about 60% to at least about 75% from the full plate area of L×W.

The forwardmost contact pads 23a, 23b of each pair of cable wires 25 may include conductive transmission traces 43 that define transmission lines leading from the termination contact pads to the mating contacts of the circuit board 15. While the contact pads 23 within each wire pair are separated by a first spacing, the transmission traces 43 are separated by a second spacing, and in the embodiment illustrated, they converge toward each other such that the second spacing therebetween is less than the first spacing between the termination contact pads 23.

Figure 8:
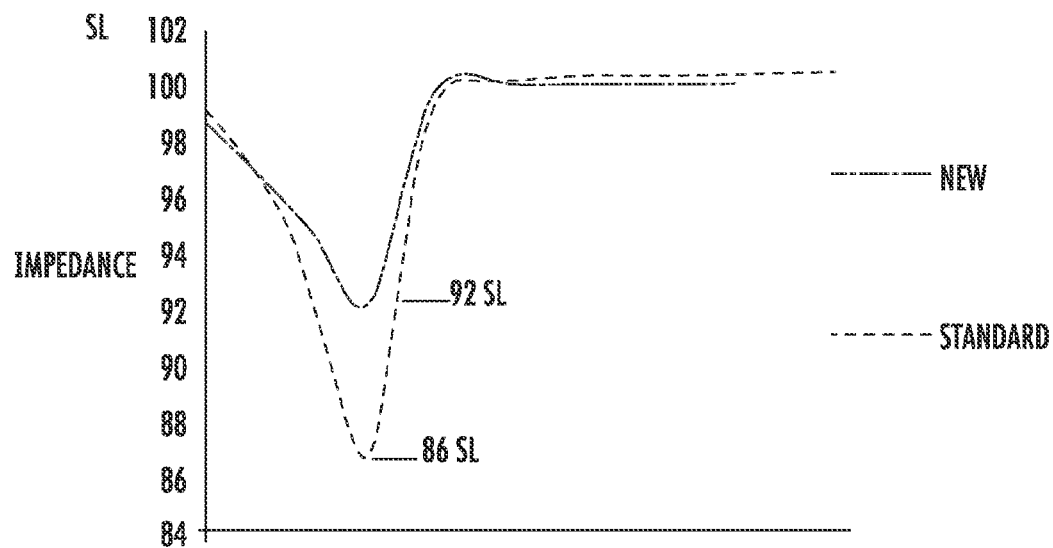
FIG. 8 is a simulated impedance plot taken from a model that compares an ordinary cable termination utilizing a singular rectangular contact pad as shown in FIG. 3 and labeled "Standard" to an improved cable termination area utilizing the dual contact pads arrangement in accordance with the Present Disclosure shown in FIG. 4, labeled "New;"

The use of two contact pads 23a, 23b for each cable wire 25 termination as opposed to one long contact pad reduces the amount of metal used in the termination area and lessens the plate area, which consequently reduces the capacitance of the connector system in the termination area. This reduction results in an increase in the impedance in the wire termination area. This has the effect of raising the impedance discontinuity curve in area C of FIG. 7, thereby bringing the impedance closer to the baseline impedance for the system. FIG. 8 is an impedance plot of a simulation through a modeled cable and termination area that covers areas A-C of FIG. 7. The impedance of a standard wire termination, that is, utilizing an elongated contact pad 23 as illustrated in FIG. 3 is shown as "Standard," and in the form of a dashed line. The impedance of a wire termination to two contact pads 23a, 23b is illustrated as "New," and takes the form of a dashed-dotted line. It can be seen that there is about a 6 ohm improvement in the new termination vs. the standard conventional style termination, raising the impedance from 86 to 92 ohms, easily achieving and bettering a +/−10 ohm tolerance for this part of the connector system.

Figure 9:
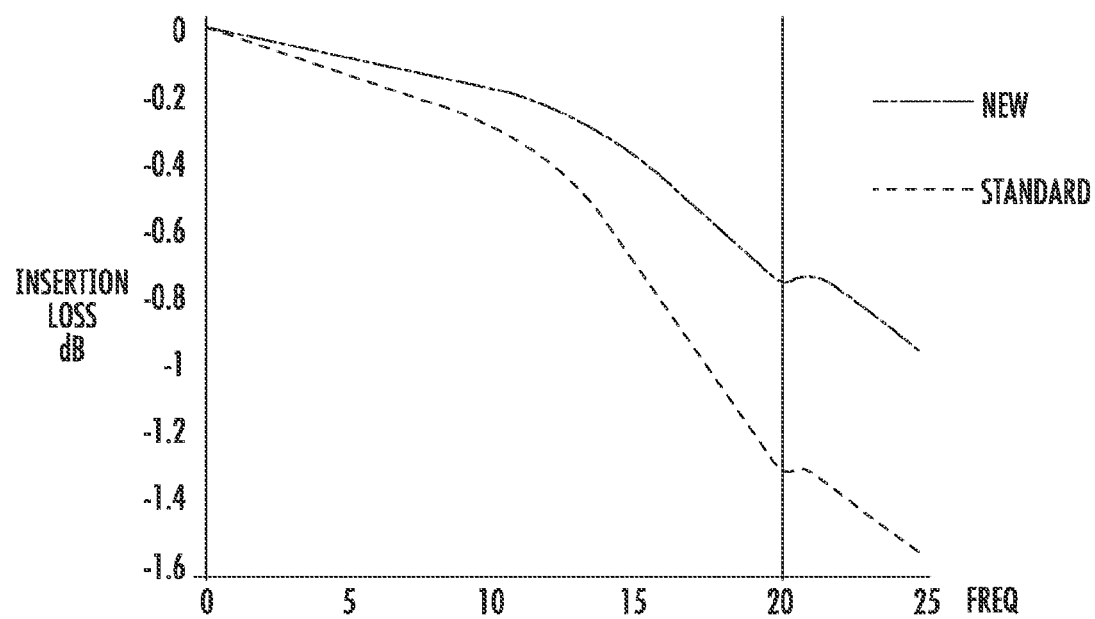
FIG. 9 is a simulated insertion loss plot taken from a model comparing an ordinary cable termination utilizing a singular rectangular contact pad as shown in FIG. 3 and labeled "Standard" to the improved dual contact pad termination area shown in FIG. 4, labeled "New.
Figure 10:
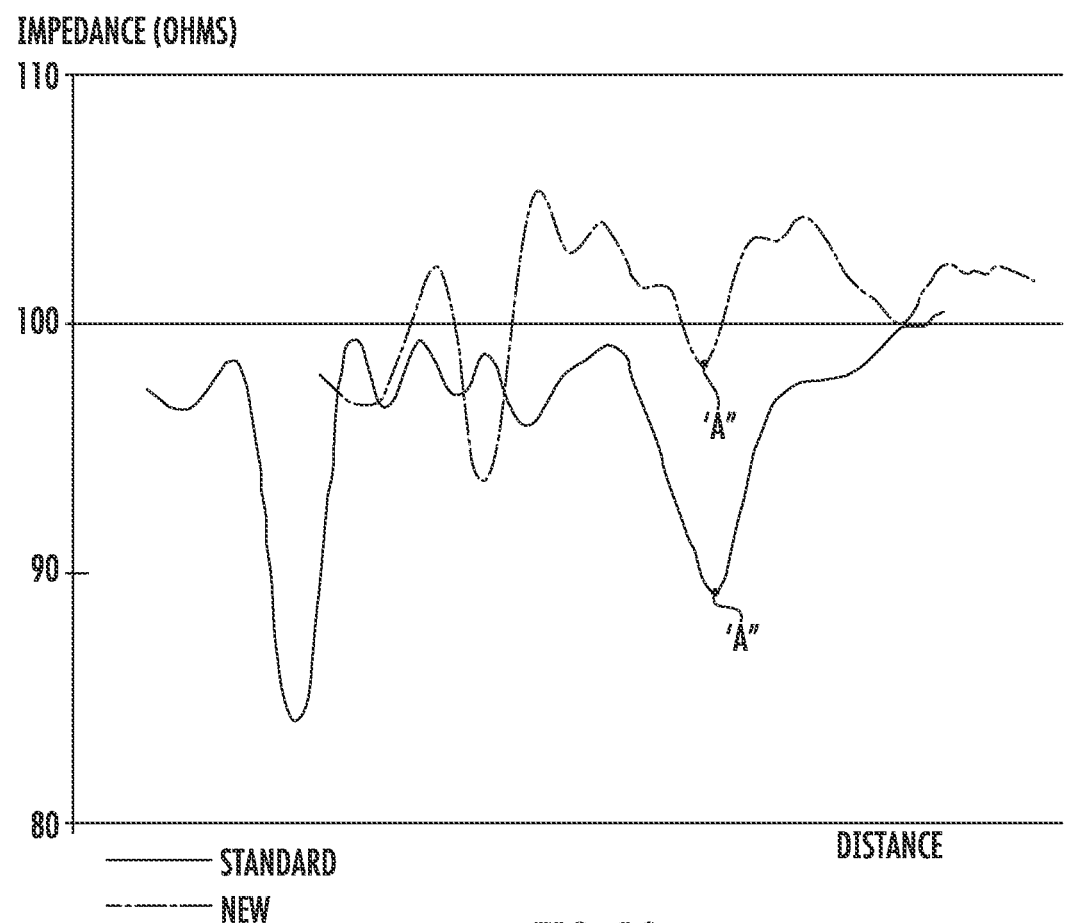
" and FIG. 10 is an actual impedance plot comparing the impedance through an ordinary cable termination utilizing a single, rectangular contact pad as illustrated in FIG. 3 to an improved dual contact pad termination area of the type illustrated in FIG. 4, with their plots respectively labeled "Standard" and "New."

A similar simulation plot of the two termination system is shown in FIG. 9, but which illustrates the insertion loss achieved. As shown in FIG. 9, the insertion loss is predicted to improve as the frequency increases and this improvement is modeled around 0.5 dB at 20 Ghz. FIG. 10 is an actual impedance plot comparing a standard termination of a connector system as illustrated in FIG. 1 to one in accordance with the Present Disclosure as illustrated in FIG. 4. The termination of both connector systems is shown at "A" on their respective plots and it can be seen that our improved termination reduces the discontinuity in this area by a significant amount, down to about 97 ohms, rather than the about 88 ohms of the standard termination, leading to an improvement of almost 90% in the impedance discontinuity at this location.

The Present Disclosure is not limited to the above-described embodiments, and may be changed and modified in various ways based on the gist of the Present Disclosure, and these changes and modifications should not be eliminated from the scope of the Present Disclosure as defined by the appended claims.

What is claimed is:

1. A cable assembly, the cable assembly comprising:
a cable, the cable including a plurality of signal-transmitting wires, pairs of the signal-transmitting wires being arranged in the cable, each signal-transmitting wire including a conductor surrounded by an insulative covering, each conductor extending forwardly past a leading edge of the insulative covering to define a free end of each signal-transmitting wire; and
a circuit board, the circuit board having opposite leading and trailing edges, the circuit board including a first portion to which the free ends are terminated and a second portion extending forwardly from and spaced apart from the first portion, the first portion including a plurality of contact pads disposed on a surface thereof, the contact pads being arranged in pairs of contact pads associated with each free end, the contact pads of each contact pad pair being aligned with each other so that a leading edge of the foremost contact pad and a trailing edge of the rearmost contact pad define a predetermined length, L, there between, the contact pads being separated from each other by an intervening spacing, the cumulative length of the contact pads being between about 0.5 L to 0.8 L;
wherein each free end of the signal-transmitting wires contacts both the contact pads of one of the pairs of contact pads.

2. The cable assembly of claim 1, wherein each contact pad pair includes a thin, conductive trace interconnecting the pads of each contact pad pair together.

3. The cable assembly of claim 1, wherein at least one pad of the pairs of contact pads encompasses a via extending into the circuit board.

4. The cable assembly of claim 3, wherein each pad of each pair of contact pads encompasses a via extending into the circuit board.

5. The cable assembly of claim 1, wherein the pairs of contact pads are spaced widthwise apart from each other by a first predetermined spacing, and the circuit board further includes conductive transmission traces extending from the forwardmost contact pads in a direction toward the first portion, the transmission traces being separated by a second spacing which is less than the first spacing.

6. The cable assembly of claim 5, wherein the transmission traces converge toward each other until separated by the second spacing.

7. The cable assembly of claim 1, wherein the contact pads have a length of about 0.8 mm, and the intervening spacing between the contact pads has a length of about 1.0 mm.

8. The cable assembly of claim 1, wherein the intervening spacing is between about 0.2 L to about 0.4 L.

9. The cable assembly of claim 1, wherein each interconnecting trace is generally centered between the pair of contact pads it connects together.

10. The cable assembly of claim 1, wherein each interconnecting trace has a width of about 25% to about 40% of a width of the contact pads.

* * * * *